United States Patent
Wunderer et al.

(10) Patent No.: US 12,543,423 B2
(45) Date of Patent: Feb. 3, 2026

(54) RESONANT CAVITY MICRO-LED ARRAY USING EMBEDDED REFLECTOR

(71) Applicant: Genesee Valley Innovations, LLC, Santa Clara, CA (US)

(72) Inventors: Thomas Wunderer, Santa Cruz, CA (US); Max Batres, Freemont, CA (US); Chris Chua, San Jose, CA (US)

(73) Assignee: Genesee Valley Innovations, LLC, Santa Clara, CA (US)

( * ) Notice: Subject to any disclaimer, the term of this patent is extended or adjusted under 35 U.S.C. 154(b) by 704 days.

(21) Appl. No.: 17/879,902

(22) Filed: Aug. 3, 2022

(65) Prior Publication Data
US 2024/0047622 A1 Feb. 8, 2024

(51) Int. Cl.
H10H 20/80 (2025.01)
H10H 20/01 (2025.01)
H10H 20/812 (2025.01)
H10H 20/821 (2025.01)
H10H 20/825 (2025.01)
(Continued)

(52) U.S. Cl.
CPC .... *H10H 20/862* (2025.01); *H10H 20/01335* (2025.01); *H10H 20/812* (2025.01); *H10H 20/821* (2025.01); *H10H 20/825* (2025.01); *H10H 20/831* (2025.01); *G02B 27/0172* (2013.01); *H10H 20/032* (2025.01); *H10H 20/034* (2025.01)

(58) Field of Classification Search
CPC .. H01H 20/862; H01H 20/821; H01H 20/825; H01H 20/831; H01H 20/01335; H01H 20/812; H01H 20/034; H01H 20/032; G02B 27/0172; H10H 20/862; H10H 20/821; H10H 20/825; H10H 20/831; H10H 20/01335; H10H 20/812; H10H 20/034; H10H 20/032
USPC ........................................................ 257/98
See application file for complete search history.

(56) References Cited

U.S. PATENT DOCUMENTS

| | | | |
|---|---|---|---|
| 5,324,964 A * | 6/1994 | Ackley | H10H 20/8142 372/45.01 |
| 6,233,267 B1 * | 5/2001 | Nurmikko | H01S 5/18341 372/50.124 |
| 7,009,215 B2 | 3/2006 | Evelyn et al. | |

(Continued)

OTHER PUBLICATIONS

Zhuang et al., "630-nm red InGaN micro-light-emitting diodes (<20 μm x 20 μm) exceeding 1 mW/mm2 f full-color micro-displays," Photonics Research, Sep. 2021;9(9):1796-1802.

(Continued)

*Primary Examiner* — Igwe U Anya
(74) *Attorney, Agent, or Firm* — Mueting Raasch Group

(57) ABSTRACT

A light emitting diode (LED) array includes bottom reflectors patterned as an array of closed shapes on a top plane of a base layer for III-N growth. A three-dimensional III-N structure is epitaxially grown around the array of closed shapes and extending above the bottom reflectors. The three-dimensional III-N structures is a contiguous crystalline structure extending across the array. A laterally grown III-N layer is formed in contact with both the reflectors and the three-dimensional III-N structures, and III-N LED layers are grown on the laterally grown layer. One or more top reflectors are grown or deposited on the III-N LED layers and located over the bottom reflectors.

21 Claims, 9 Drawing Sheets

(51) Int. Cl.
*H10H 20/831* (2025.01)
*G02B 27/01* (2006.01)

(56) References Cited

U.S. PATENT DOCUMENTS

| | | |
|---|---|---|
| 8,541,788 B2 | 9/2013 | Denbaars et al. |
| 9,653,642 B1 | 5/2017 | Raring et al. |
| 10,249,786 B2 | 4/2019 | Batres et al. |
| 10,267,486 B1 | 4/2019 | Mao et al. |
| 10,707,374 B2 | 7/2020 | Danesh et al. |
| 2018/0309965 A1* | 10/2018 | Ahmed ............... H04N 23/20 |
| 2023/0047142 A1* | 2/2023 | Ooi ...................... H04B 10/116 |

OTHER PUBLICATIONS

Yeh et al., "GaN-Based Resonant-Cavity LEDs Featuring a Si-Diffusion-Defined Current Blocking Layer," IEEE Photonics Technology Letters, Dec. 15, 2014; 26(24):2488-2491.

Wunderer et al., "Tree-dimensional GaN for semipolar light emitters," Phys Status Solidi B, 2010;1-12.

Chen et al., "GaN-Based Resonant-Cavity Light-Emitting Diodes grown on Si," Nanomaterials, 2022;12;134: 8 pgs.

Lida et al., "633-nm InGaN-based red LEDs grown on thick underlying GaN layers with reduced in-plane residual stress," Appl. Phys. Lett, 2020;116:162101; 6 pgs.

* cited by examiner

RESONANT CAVITY MICRO-LED ARRAY USING EMBEDDED REFLECTOR

SUMMARY

The present disclosure is directed to a micro light emitting diode array using an embedded reflector. In one embodiment, a light emitting diode (LED) array includes a base layer for III-N semiconductor growth. Bottom reflectors are patterned as an array of closed shapes on a top plane of the base layer. A three-dimensional III-N structure is epitaxially grown around the array of closed shapes and extends above the bottom reflectors. The three-dimensional III-N structure is a contiguous crystalline structure that extend across the array. A laterally grown III-N layer is formed in contact with both the reflectors and the three-dimensional III-N structures, and III-N LED layers are grown on the laterally grown II-N layer. One or more top reflectors are grown or deposited on the III-N LED layers and located over the bottom reflectors. An array of electrical contacts are coupled to respective p-type materials and n-type materials of the III-N LED layers. Current delivered by the electrical contacts causes non-coherent, spontaneous light emissions through one of the top reflectors or bottom reflectors.

In another embodiment, a method involves patterning bottom reflectors an array of closed shapes on a top plane of the III-N semiconductor layer. An epitaxial three-dimensional III-N structure is selectively grown around and extends above the array of closed shapes. The three-dimensional III-N structure is a contiguous crystalline structure that extends across the array of closed shapes. The method further involves laterally growing an III-N LED layer in contact with both the bottom reflectors and the three-dimensional III-N structures and growing III-N LED layers on the laterally grown III-N layer. One or more top reflectors on deposited or grown on the III-N LED layers. Electrical contacts are deposited on respective n-type material and p-type material of the III-N LED layers.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
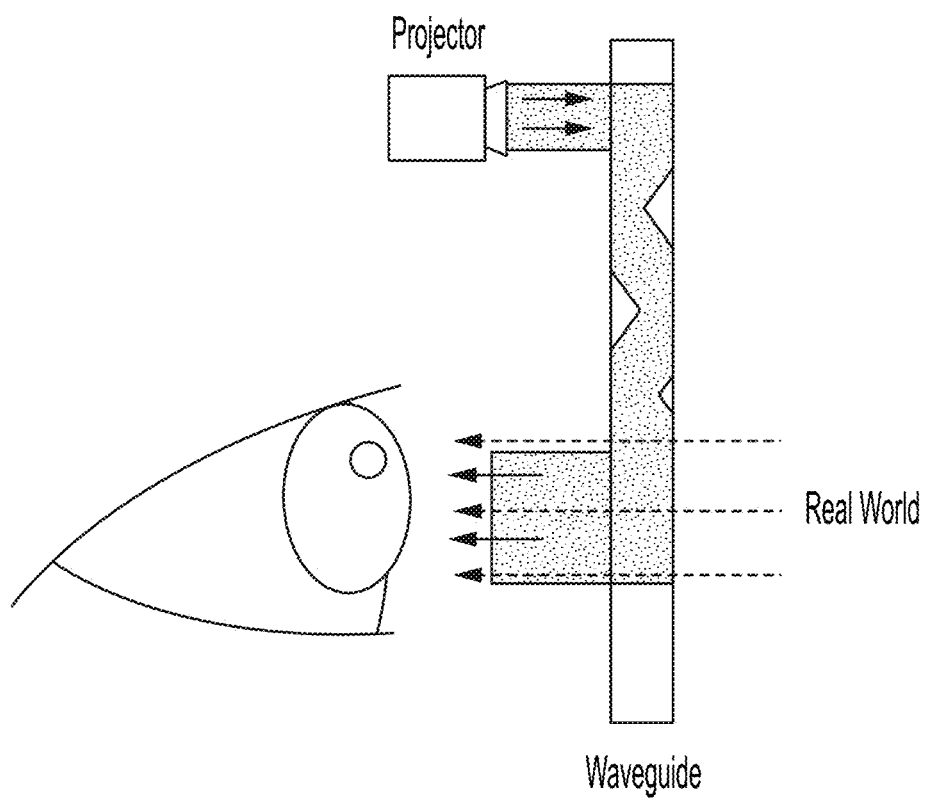
FIG. 1 is a diagram of an augmented reality display according to an example embodiment.

The present disclosure is generally related to electronic display devices. Displays commonly used for computers, televisions, mobile devices, etc., use an array of active elements such as light emitting diodes (LEDs) and/or liquid crystal display (LCD) cells built onto a substrate. The active elements can be electrically controlled to individually set an intensity and color (for full color displays) at each (sub-) pixel. Alternatively, the image might be formed on a screen or the retina of the human eye via a projector-like light engine. Therefore, a single light beam for the individual colors (e.g., red, green and blue) might be scanned in both horizontal and vertical direction via one or more switchable mirrors.

In a technology known as augmented reality (AR), a display is built into a transparent viewer (e.g., glasses) that is positioned in front of the user's eye. An image is displayed on the glasses such that a computer-generated image can be superimposed on a real-life scene seen by the viewer. This type of image superposition is used in other technologies such as head up displays, although an AR display is preferably wearable and close to the eye of the user. In an extreme case, the display might be integrated into a contact lens-like form factor and placed in direct contact with the human eye. Other wearable devices such as virtual reality (VR) displays may also make use of a display close to the user's eye, however do not necessarily allow the user to see outside of the display through a clear lens.

Because an AR display is intended to be placed close to the eye, the light pixels should be very small to support the needed display resolutions. Another desirable property is that the light source has high "brightness" to be captured into projector systems inherent in AR systems and to compete against daylight in the composite image. Currently, a light source being investigated that satisfies the brightness requirement is a laser. However, lasers may not provide the desired resolution as implemented in today's commercial products and may pose an eye safety hazard.

There is consensus that the ideal light source for AR displays are micro-LEDs. However, the main challenges in adopting micro-LEDs toward AR are that it is hard to scale the size of micro-LEDs down to sub-5 μm sizes because sidewall defects lead to carrier recombination that harms efficiency. Also, existing micro-LEDs do not have sufficient brightness to meet the needs of AR displays. Note that while AR and VR displays are described as motivating the embodiments described below, the technologies described below can be used for a wide range of applications, including non-display applications or display applications where the display is distant from the eye.

Embodiments are described herein that address both the size and brightness problem at the chip level. These designs can result in high resolution, high brightness (nits), and high color rendering display technology for the implementation in next generation AR/VR headsets, for example. The embodiments address the issue of limited pixel resolution and "useable light" in current AR/VR headsets by providing a light engine featuring directional beam properties. The embodiments provide the means of realizing micron-sized sub-pixel light emitters that can be densely spaced in an array. More generally, the techniques can be used to form individually addressable pixel elements that are about 0.2-20 μm in diameter. Note that the LED emitters described herein can be used in other types of display applications, e.g., virtual reality displays, mixed reality displays, head up displays, wearables, watches, mobile phones, pico-projectors, curved displays, light field displays, active contact lenses, etc. Other non-display applications might include optical communications or visible light communication (e.g., free-space, fiber-coupled, and on-chip), illumination, etc.

Many of today's light engines for AR/VR displays rely on laser emission as the illumination source. For example, three different laser beams for red, green, and blue emission might be used for full color displays. An example of a display usable with a laser light source is shown in FIG. 1. The laser beams are typically projected onto MEMS-based micro-mirrors for scanning the beams in vertical and horizontal direction. The laser beams are then reflected from the micro-mirrors to enter the human eye for directly creating the image on the retina of the eye. In some cases, the light is further guided in an optical waveguide before being directed into the eye. This technology raises safety concerns working with direct laser beams being projected into the human eye. In addition, image resolution is fundamentally limited with such an implementation and fabrication challenges for the optics in such systems are manifold.

Figure 2:
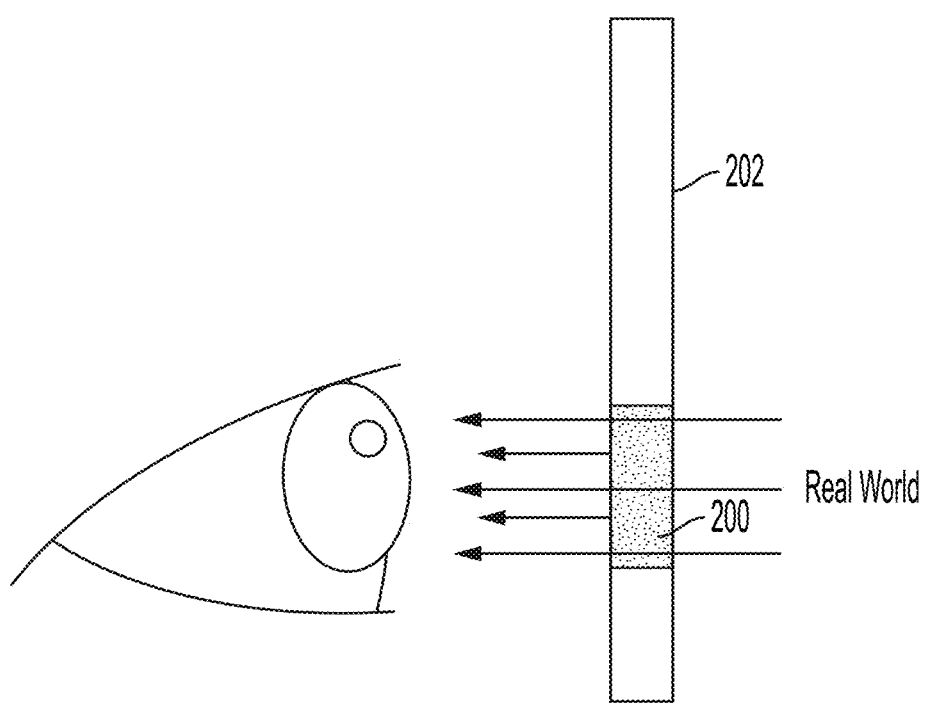
FIG. 2 is a diagram of an augmented reality display according to another example embodiment.

The proposed embodiments address these issues. First, the images are not formed via scanning laser beams but via using an array of micro-LEDs as the pixel or sub-pixel elements. These produce non-coherent, spontaneous light emission, which reduces safety concerns. The proposed devices will implement a special LED architecture, referred to as a resonant-cavity light emitting diode (RC-LED) design, that addresses the second issue, namely that of resolution. An example of an RC-LED display 200 is shown in the block diagram of FIG. 2. Generally, the RC-LED display 200 can be made substantially transparent and mounted on a viewer 202, e.g., eyeglass lens, face shield, etc. Note that the RC-LED display 200 (or sub-components thereof) can also be integrated into other light delivery mechanisms, such as via waveguides, reflectors, etc. For example, the projector shown in FIG. 1 could use an RC-LED embodiment instead of a laser as the light source.

Figure 3:
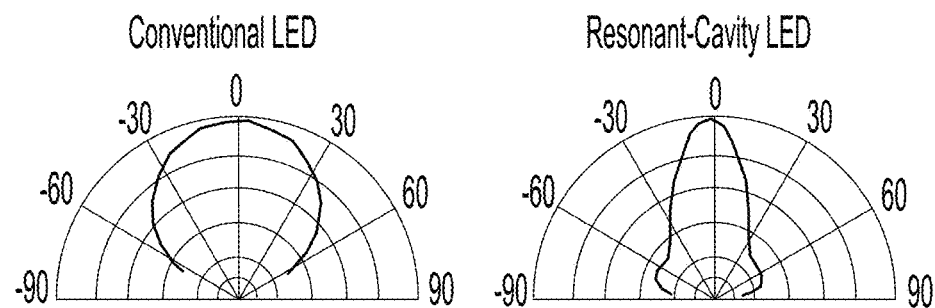
FIG. 3 is a plot illustrating emission patterns of a resonant cavity light emitting diode according to an example embodiment.

In FIG. 3, a pair of plots illustrate the difference in emission/radiation patterns between conventional LEDs and RC-LEDs. Conventional (μ-)LEDs produce a substantially Lambertian radiation pattern, while RC-LEDs produce light with a preferred directionality. This directionality of the RC-LEDs is useful for high-resolution microLED displays where the pixel pitch is small and conventional approaches to narrow the emission beam angle (increasing nits) is in direct conflict with efforts to decrease the pixel pitch, due to fundamental physics constraints of etendue conservation.

Most approaches and implementations for micro- and mini-LEDs for display applications do not provide a meaningful solution for addressing the etendue constraint (also referred to as beam shaping). Optics systems for AR/VR, regardless of design approach, most effectively deliver light to the pupil of the observer using low etendue light sources. Low etendue maximizes power efficiency and brightness while minimizing pixel crosstalk and other optics aberrations from stray light rays. Because it is a violation of fundamental physics for added optical elements to decrease etendue, etendue is minimized at the point of light creation. No passive secondary optic design feature can rectify this inherent property. Non-imaging-optics approaches to beam shaping, for example, utilize a larger area of the light exit face as compared to the active region area, resulting in either a decrease in resolution or an increase in current density, which in turn diminishes internal quantum efficiency at the high current density associated with high resolution AR/VR.

The embodiments described herein provide a method for minimizing etendue at the light origination source (the microLED light engine) while not sacrificing efficiency or resolution, and in a manner that is safe to the human eye. Said another way, the embodiments create a narrow beam angle to better couple light (e.g., directly into the eye or to optical waveguide or other optical elements), resulting in more useable light arriving at the pupil of the viewer. The approaches described herein employ cavity effects in the form of the RC-μLED to overcome the etendue constraint. We consider this approach to overcoming etendue issue as advantageous in meeting the requirements for next generation AR/VR displays.

Figure 4:
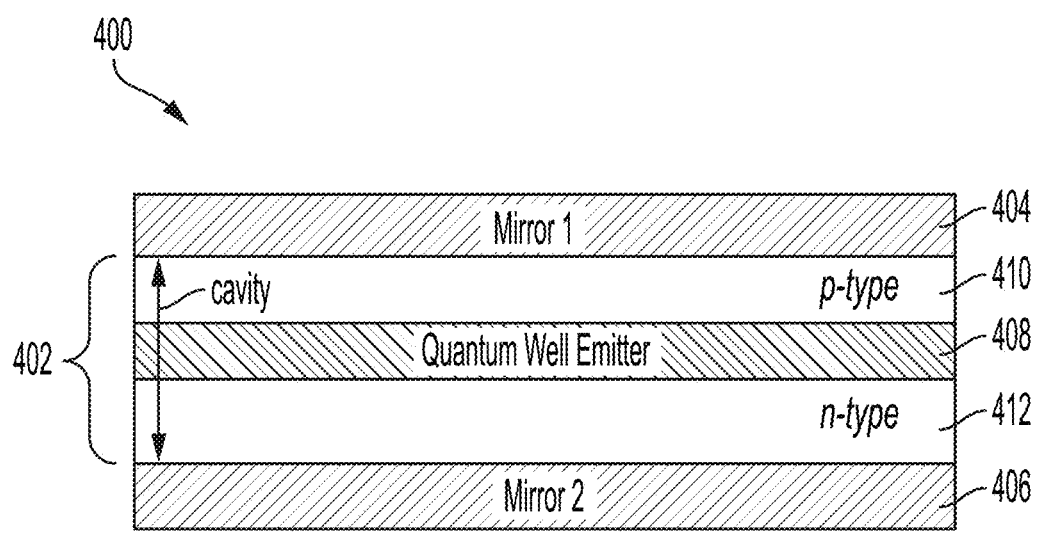
FIG. 4 is a diagram showing the structure of a resonant cavity light emitting diode according to an example embodiment.

In FIG. 4, a block diagram shows details of an RC-μLED element 400 according to an example embodiment. A cavity 402 is formed between two mirrors 404, 406. The mirrors 404, 406 are also referred to as "reflectors" elsewhere herein. The cavity 402 includes a quantum well (QW) emitter 408 surrounded by a p-type material layer 410 and an n-type material layer 412. A current is applied to the p-type and n-type layers 410, 412 which causes light to be emitted from the quantum well emitter 408 and reflected between the mirrors 404, 406. Note that mirrors 404, 406 and any of the layers in the cavity 402 may be multilayer structures. In one embodiment, the multilayer structures might include a distributed Bragg reflector comprising alternating layers of two different materials with a substantial difference in the refractive index and with the thickness being about a quarter wavelength for each layer. In other embodiments, one or both of the mirrors 404, 406 may be metallic reflectors or Bragg gratings.

In response to electrical forward current applied through the p-type and n-type layers 410, 412, spontaneous light emission will be produced in the quantum well region 408. Non-coherent (or partially coherent) light is emitted from the element 400 via one of the mirrors 404, 406. Note that this structure of the element 400 is similar to a vertical cavity surface emitting laser (VCSEL), except that the reflectivity of the emitting mirror 404, 406 is substantially lower in this element 400 than in a VCSEL. In some embodiments, the reflectivity of the emitting mirror 404, 406 is less than 95%, and can be as low as 90% or less in other embodiments. This ensures that more light is emitted per photon round trip from the cavity such that no lasing threshold can be reached, and therefore poses less optical damage risk to the viewer.

The reflectivity of the mirrors 404, 406 can be different or similar such that light will be emitted from one of the mirrors but not the other. As described elsewhere herein, the mirror 404 may have different structures and materials than mirror 406 (e.g., distributed Bragg reflector, Bragg grating, metallic film, etc.). The layers of the element 400 will be formed by a combination of material deposition/patterning and crystalline growth, but need not follow the bottom-to-top order shown in FIG. 4. A number of elements 400 will be formed in an array on a substrate, such that each element 400 can be individually addressed and activated to form a display image or provide other functionality of an LCD array.

A special fabrication technique is described for fabricating RC-LEDs at sizes (e.g., less than 20 μm across per individual light emitting element) useful for augmented reality and virtual reality displays. Selective area epitaxy is chosen as a key enabler for embedding highly reflective dielectric distributed Bragg reflector (DBR) mirrors within the semiconductor compound. A proposed method provides the means of fabricating GaN-based resonant-cavity micro-LED arrays for the implementation as (sub-) pixel elements in next generation AR/VR headset displays.

Figure 5:
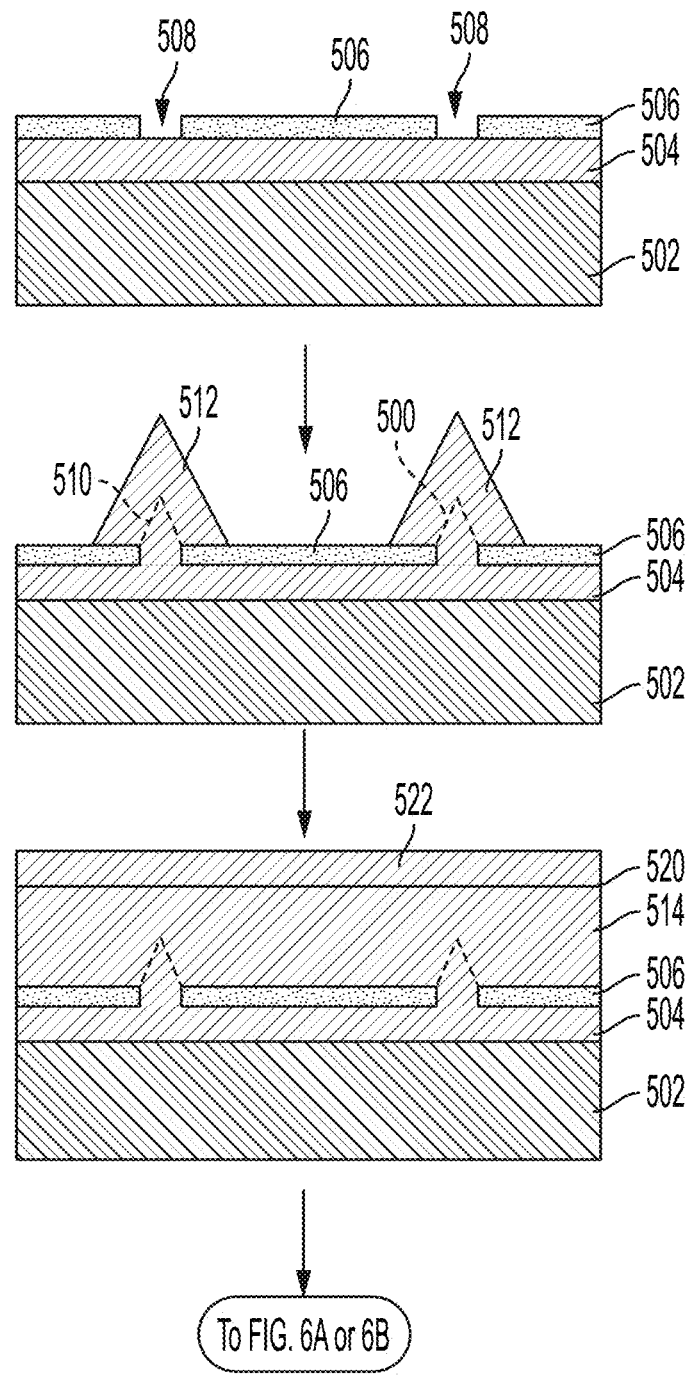
FIGS. 5, 6A, 6B, and 6C are diagrams showing the formation of a device according to example embodiments.

In FIGS. 5, and 6A-6C, block diagrams show an example of process steps that can be used for forming an LED display according to an example embodiment. As seen in the top of FIG. 5, the device is grown on a base layer, which may include a substrate 502 (e.g., sapphire, silicon with <111> crystal orientation, SiC, etc.) on which is grown a layer 504 of group III and nitrogen alloy (III-N) semiconductor material (e.g., GaN). In other embodiments, a bulk III-N substrate may be used as the base layer instead of the separate substrate 502 and growth layer 504. Note that while the embodiments described herein describe epitaxial growth of III-N materials, in particular GaN compounds, for visible light emitters, similar techniques may be employed using different materials such as AlGaInP, AlGaInAs, etc., which may be used for other emitters that operate at other wavelengths, for example.

A bottom reflector 506 is deposited on the semiconductor layer 504. The reflector 506 may include a dielectric distributed Bragg reflector (DBR) mirror. Typically, a DBR mirror may be formed as a stack of dielectric materials (e.g., $SiN/SiO_2$ stack) that have different indices of refraction and where the layer thickness for each layer is about a quarter of the optical wavelength (e.g., for an emission wavelength of 460 nm and the refractive index of SiO2 being n~1.45 the physical layer thickness would be d=460 nm/4/n=79.3 nm). Other types of structures or materials may be used for the bottom reflector 506, which is described elsewhere herein.

Figure 7:
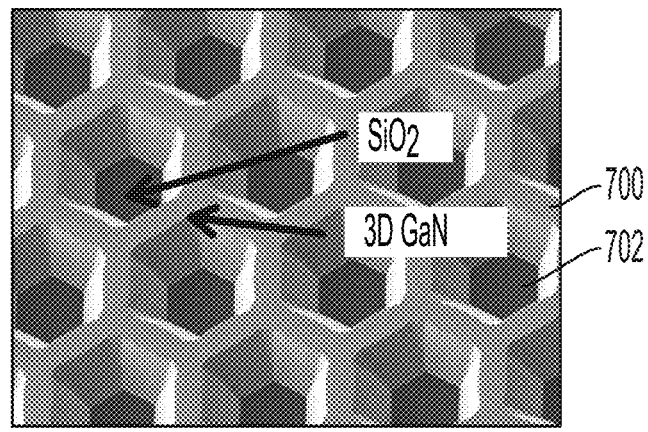
FIGS. 7 and 8 are images showing a partially fabricated device according to example embodiments.

Openings 508 are formed in the bottom reflector 506 using, e.g., photo-lithography and dry etching. The openings 508 may include a honeycomb pattern as seen in FIG. 7, for example. The openings 508 allow for epitaxial growth of the III-N semiconductor material over the bottom reflector 506 in the next processing phases. The portions of the reflector 506 between the openings 508 may also define the boundaries of individual emitters, e.g., a pixel or sub-pixel of a display.

A next phase of the manufacturing process is shown in the middle of FIG. 5. The wafer containing the growth substrate/template 502, 504 and bottom reflector 506 is loaded into a III-N growth chamber (e.g., for metal-organic vapor phase epitaxy, MOVPE). A three-dimensional (3D) structure 510 is grown through the openings 508 using 3D growth conditions. The growth conditions are transitioned to lateral growth conditions resulting in structures 512 that extend over the top of the bottom reflector 506. In one embodiment, this lateral growth is continued until the bottom reflector is completely covered by a III-N material layer 514 as seen at the bottom of FIG. 5.

The laterally grown layer 514 on the bottom reflector 506 is part of an LED heterostructure. The layer 514 may be planarized before adding additional material layers. The layer 514 may be formed of n-type III-N semiconductor, upon which is built layers forming an active zone 520 including one or multiple quantum wells (QWs) or other light producing elements and a p-type material layer 522. Note the III-N layer 504 and structures 510, 512 may also be formed of an n-type III-N material compatible with layer 514, e.g., the same material or an n-type material of slightly different composition, including for example InGaN, AlGaN and AlGaInN. The additional layers 520, 522 may also be grown using metal-organic vapor phase epitaxy resulting in a crystalline structure for the LED heterostructure.

Figure 6A:
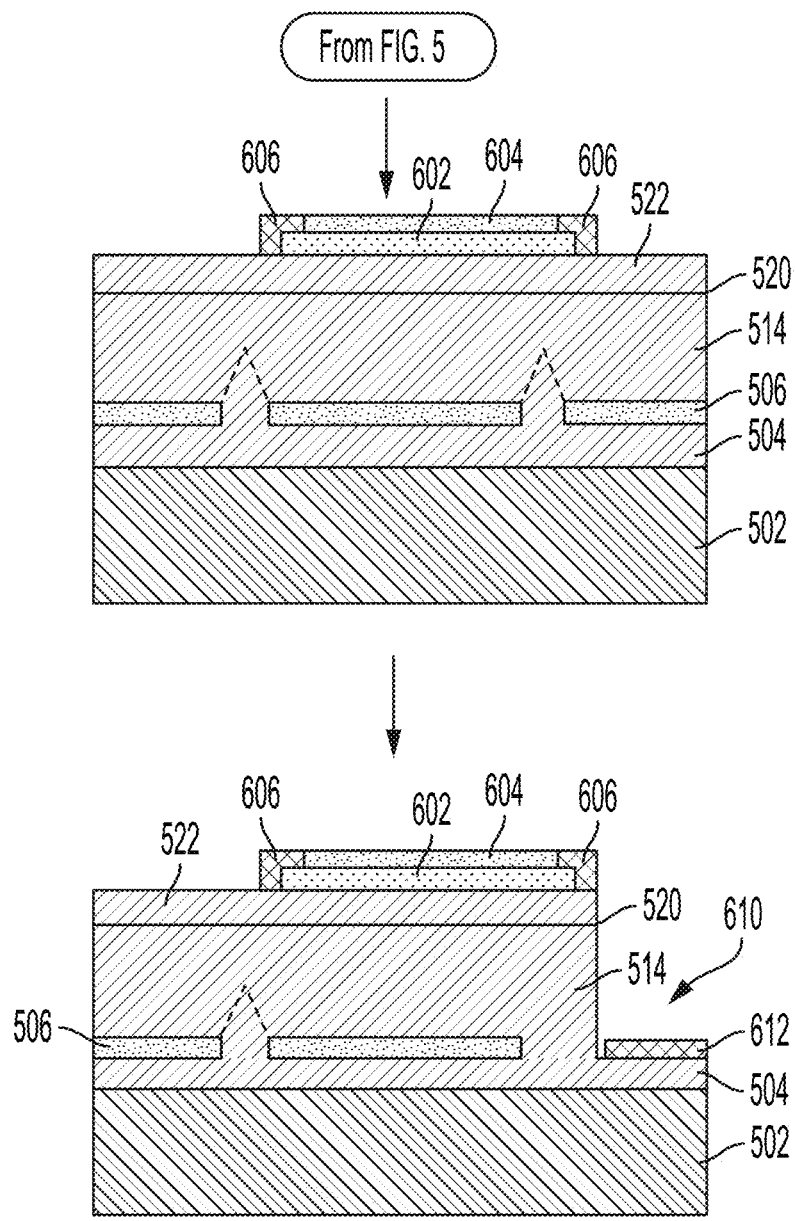

The remaining manufacturing processes according to one embodiment are shown in FIG. 6A. At the top of FIG. 6A, a transparent conductive oxide (TCO) film 602 (e.g., indium-tin-oxide, or ITO) is patterned on top of the p-type material layer 522 where it serves as a positive contact for the LED element. A top reflector 604 is formed over the TCO film 602 and may include a dielectric DBR. Electrical contacts 606 are formed around part of the TCO layer and serve as an anode for the LED element. As seen in the bottom of FIG. 6A, a trench 610 is formed that exposes the n-type layers 514, 504 and an electrical contact 612 is formed that serves as a cathode for the LED element. The electrical contact 612 can be formed on n-type layers 514, 504 or be coupled anywhere to the substrate 502 in case it provides sufficient n-type conductivity. The electrical contacts 606, 612 may be formed of a TCO or a metal or a stack of such films.

Figure 6B:
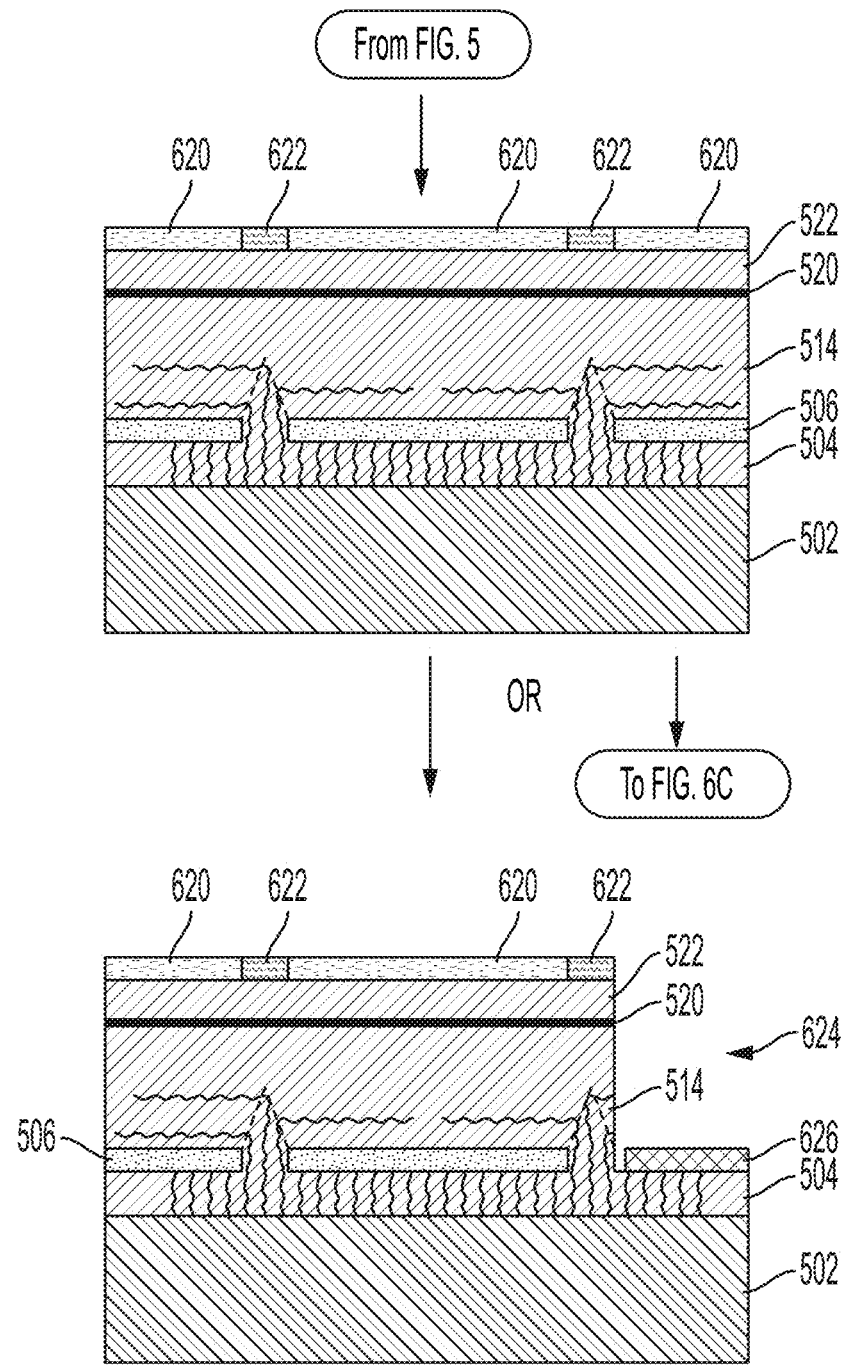

In FIG. 6B, an alternate approach to FIG. 6A is shown. In this case, the top reflector 620 is a reflective metallic film, such that an ITO film may not be needed and the reflector 620 can be formed directly on layer 522, e.g., using an appropriate adhesion layer and/or diffusion barrier. In this case, the top reflector 620 itself can serve as the positive contact, or other metal features can be formed directly on the top reflector 620 to perform an electrical contact function. Note that an optional dielectric protective material 622 (e.g., $SiO_2$) may be deposited around the top reflector 620. Also note that additional reflector portions 620 are shown on the left and right side of the material stack, and these serve as top reflectors for adjacent LED elements.

As seen in the lower part of FIG. 6B, a trench 624 is formed that exposes the n-type layers 514, 504 and an electrical contact 626 is formed that serves as a cathode for the LED element. In the top part of FIG. 6C, a diagram shows an alternative to forming a cathode trench. In this example, the substrate 502 has been removed and cathode contacts 630 are formed on the bottom surface 632 of the LED element. Removal of the substrate 502 also allows the LED element to emit from the bottom surface 632, thus the cathodes 630 are shown spaced away from the top reflector 620. In other embodiments, the cathode contact 630 may include ITO or some other TCO which is applied uniformly as a continuous film on the bottom surface 632 instead of individual contact shapes as shown. Note that this bottom cathode approach may also be used with the reflector configuration shown in FIG. 6A. At the bottom of FIG. 6C, optional trenches 640 are shown that may be formed partially or fully around the LED element to form mesas, which increases electrical and/or optical isolation between adjacent LED elements. The trenches 640 need not extend to the depth shown, e.g., may stop above the active zone 520. Note that isolation trenches and mesas may also be used in other embodiments, e.g., as shown in FIGS. 6A and 6B.

Figure 6C:
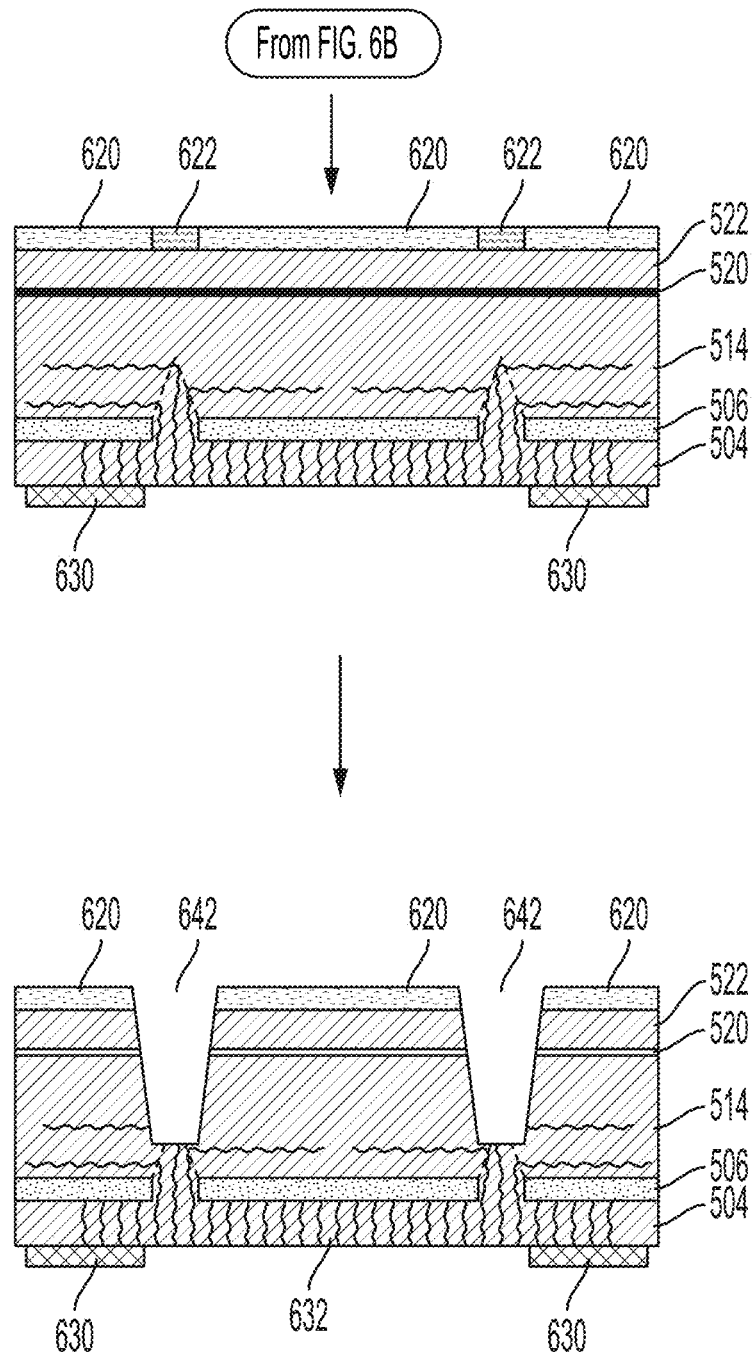

The embodiment shown in FIG. 6A allows greatest flexibility in the design, e.g., top or bottom emitter (e.g., using a transparent substrate or substrate removal as shown in FIG. 6C), and precise selection of mirror reflectivities. The embodiments shown in FIGS. 6B and 6C may be simpler to implement, in that the optical reflectivity requirements of the reflector 620 can be combined with the electrical current injection properties of the contact. A highly reflective metal (e.g., metals that include Ag, Al, Cu, Au, the metal being selected based on having a high reflectance at the emission wavelength) contact/reflector could be substituted for the ITO and DBR mirror as seen in FIGS. 6B and 6C.

In FIG. 7 an electron microscope image shows an example of the 3D structures grown as described in FIGS. 5 and 6. The image in FIG. 7 represents the device at a manufacturing phase such as shown in the middle of FIG. 5. The 3D structures in FIG. 7 are in a hexagonal, honeycomb pattern aligned to the crystallographic orientation of the III-N substrate or template. Note that the 3D structures may be referred to elsewhere herein in the plural as "structures" because each is associated with a different LED, however the view in FIG. 7 shows that this component is actually a single contiguous crystalline structure 700 extending across the plane of the array, surrounding an array of closed shapes 702.

Note that each hexagonal shape shown in FIG. 7 may correspond to an individually addressable pixel or sub-pixel. In the latter case, for example, three adjacent hexagonal shapes may each emit at different wavelengths (e.g., RGB), the combination of the three sub-pixels forming a single, full-color pixel, the color of the pixel being set by individual activation levels of the sub-pixels. For monochrome displays, each hexagonal shape may correspond to an individual pixel. Other combinations of the hexagonal shapes may be possible. For example, multiple hexagonal shapes may be tied together under a single contact pair so that they are activated together. Different numbers of shapes could be individually combined this way to provide desired properties, e.g., combining two elements for one color, three elements for a different color, etc.

Figure 8:
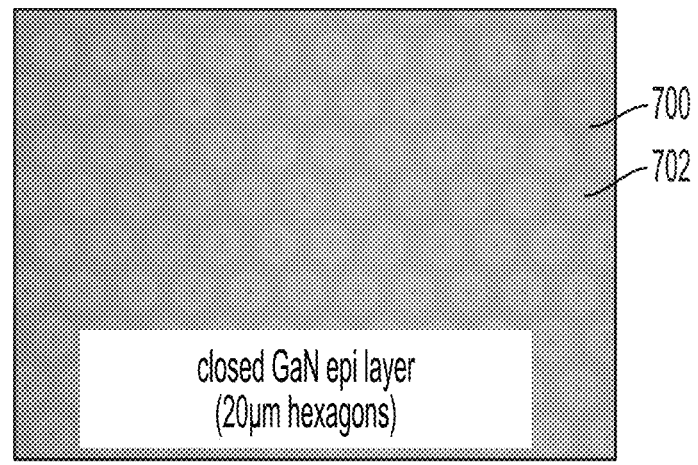

The image in FIG. 8 is an optical microscope image and corresponds to a manufacturing phase such as seen in the bottom of FIG. 5, where the top epitaxial layer is closed. These structures were grown on a 2-inch substrate with an approximately 4-hour growth time to achieve the closed layer in FIG. 8. While these results are for 20-30 µm large geometries, much smaller structures are possible, e.g., as small as 0.2 µm, and would require a significantly shorter growth duration.

Note that even when viewed close up at microscopic scales, the 3D crystal growth is highly uniform, e.g., no rough edges, sharp corners, no variation in height, etc. Existing 3D growth of uLED pixels often employ nanowire or pyramidal type growth modes where the 3D features are discontinuous islands. It is difficult to grow these discrete features with the high degree of uniformity across a whole wafer necessary for display applications. This non-uniformity in structure in turn causes failures in the form of dead pixels, color non-uniformity, and overall device yield and fabrication problems. This 3D growth phase described herein, e.g., in the middle of FIG. 5, produces structures which are contiguous and crystallographic, properties which directly enable extremely uniform structures. While the second phase of the growth, where the light emitting active regions are grown, proceeds in a discontinuous manner, the bounds of the growth are already established with high uniformity by the first growth phase structure. Further, the challenges of obtaining uniform 3D crystal structures gets worse using conventional methods as the sub-pixel size and pitch grows smaller. This is not the case for the contiguous growth design; in fact the opposite is true—the uniformity improves as dimensions decrease. This is again due to the contiguous, crystallographic nature of the initial growth.

As the substrate wafer size grows larger, the challenges to uniformity of discrete 3D structures are further magnified due to the increasing inhomogeneity of MOVPE reactor transport and kinetic processes, which is a well-known problem in the field. It is believed that the technical and economic challenges of fabricating AR/VR microLED light engines will require 300 mm Si substrates to be used. Given that leading manufacturers of display epitaxial material use no larger than 150 mm substrates, the ability to grow uniform structures on 300 mm, highly lattice mismatched substrates represents a formidable barrier to the production of uniform, high yield and high performance sub-pixel arrays. Here also, the design of the 3D growth of a contiguous structure across the can enable this degree of uniformity.

The uniformity challenge is yet again compounded by the need for resonant cavity devices to have precisely controlled cavity thickness (e.g., the distance between the light emitter 520 and one or both reflectors 506 and 604 as seen FIG. 6A). In the case of uLED arrays, this means that the z-height of the epitaxially grown material must be precisely controlled and uniform across the entire wafer. The strategy of contiguous epitaxial growth followed by overgrowth over a reflector enables this uniformity of the cavity to be achieved.

Resonant cavity effects also address other challenges associated with AR/VR light engines. First, surface recombination is often pointed to as a barrier to decreasing sub-pixel size. In this view, carriers diffuse to the edge of the QW, where they recombine non-radiatively due to interactions with surface states that are not easily avoided at edges. The design described by the disclosed embodiments has three aspects that mitigate this problem. First, the QWs are bounded on either side by the 3D structure (e.g., structure 510 in FIG. 5 and structure 700 in FIG. 7) from the first growth phase. This can protect the QWs from being exposed to a mesa etch, which is commonly held to exacerbate the surface recombination effect. Second, the recombination lifetime of resonant devices is known to be decreased relative to the non-resonant case. This is expected to reduce the carrier diffusion length and subsequently the supply of excitons to the edge of the device, where they recombine non-radiatively. Incidentally, this decrease in recombination lifetime also holds benefits for visible light communication systems, where bandwidth is direct function of switching speed, which in turn is limited by recombination lifetime.

The resonant cavity LED shown in FIG. 6A is realized using two dielectric DBR stacks embedded in GaN that act as top and bottom reflectors. In FIGS. 6B and 6C, the bottom reflector uses a dielectric DBR stack. Theoretically the DBRs could also be epitaxially grown, e.g., using GaN/AlInN, GaN/AlGaN, AlGaN/AlGaN, etc. However, high performance epitaxial III-N DBRs are challenging to fabricate. Also, doping of epitaxial DBRs are problematic in III-N.

Instead of embedding the dielectric DBR in GaN via selective area growth the DBR might be deposited after epi-transfer to a carrier wafer and substrate removal (e.g., laser lift-off). However, the precise control of the cavity thickness in such a case could become challenging, and thermal management could be impacted. In addition, unintentional crystallographic roughening of the now exposed, highly reactive N-face layers (e.g., layer 504 in FIG. 5) is yet another challenge with epi-transfer.

In other embodiments, the top and/or bottom reflector could comprise a laterally structured Bragg grating instead of a DBR. The fabrication of such a grating would be similar to what is shown in FIGS. 5 and 6, only that the material for reflector 506 need not be a multilayer dielectric structure (e.g., could be an epitaxial material), and that the spacing between openings 508 would be much smaller than would be used if a DBR were formed. Also note that reflective metal films could be used for one or both of the top and bottom reflectors.

Figure 9:
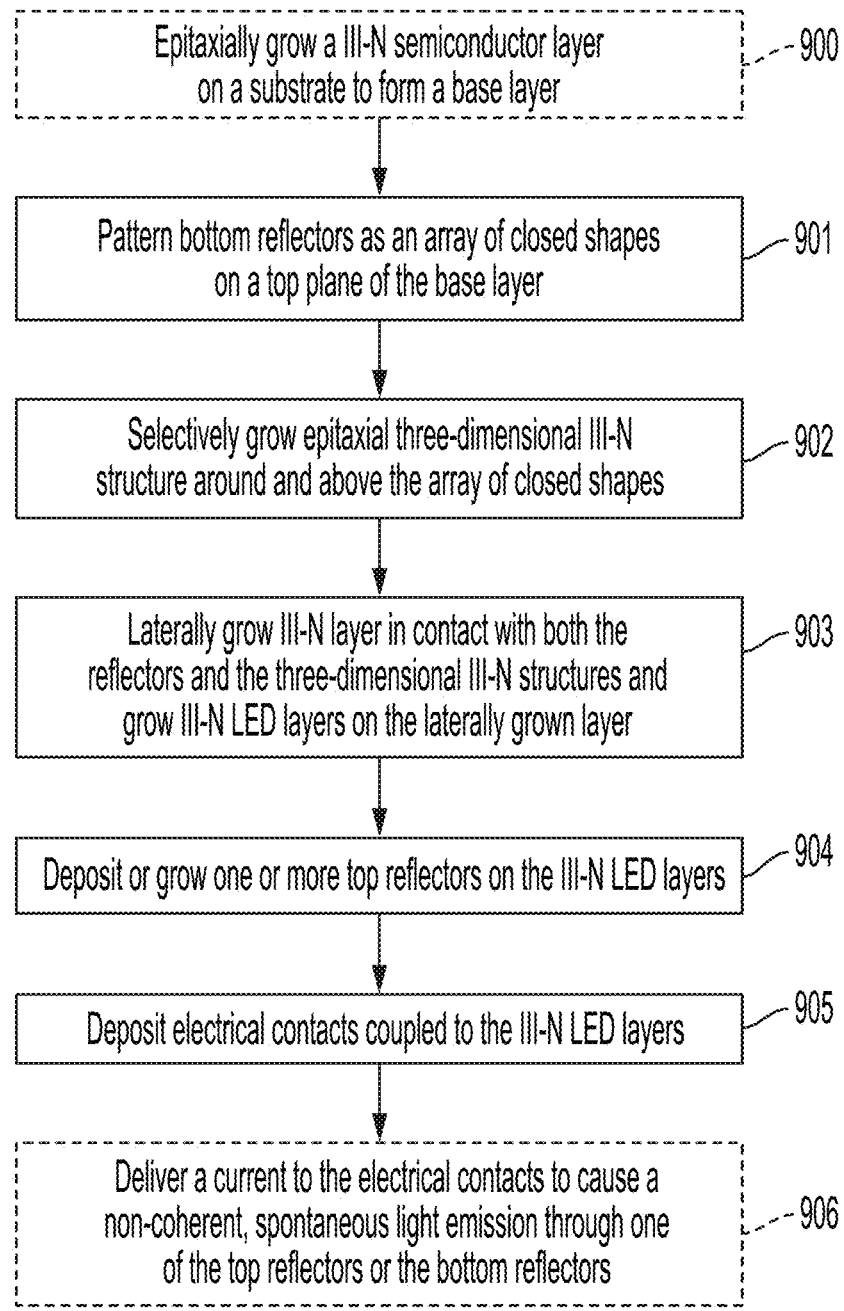
FIG. 9 is a flowchart of a method according to an example embodiment.

In FIG. 9, a flowchart shows a method according to another example embodiment. The method optionally involves epitaxially growing (900) a III-N semiconductor layer on a substrate or growth template, or otherwise providing a base layer for epitaxial growth of III-N layers. The method involves patterning (901) bottom reflectors as an array of closed shapes on the substrate or growth layer, which may include the epitaxially grown III-N semiconductor layer. The closed shapes may be honeycomb shapes (hexagons), circles, squares, stars, triangles, etc. Also note that the closed shapes may be arranged in any pattern regardless of their shape, such as a staggered array (e.g., honeycomb pattern as shown in FIG. 7), rectangular grid, radial pattern, etc. Generally, the closed shapes define individual elements (e.g., pixel, sub-pixel, optical transmitter) of an array that is built on the substrate or growth template.

The method further involves selectively growing (902) an epitaxial three-dimensional III-N structure around and extending above the array of closed shapes and laterally growing (903) a III-N layers in contact with both the reflectors and the three-dimensional III-N structures, and growing III-N LED layers on the laterally grown layers. The III-N LED layers include at least n-type and p-type materials that surround an active zone comprising one or more quantum wells (QW). The method may involve planarization within or after operations 902 and/or 903 to prepare the surfaces before then next growth layers are added.

The method further involves depositing or growing (904) one or more top reflectors on the III-N LED layers. A TCO layer may optionally be deposited before the top reflectors, e.g., where the top reflectors are non-conductive, e.g., dielectric DBR films. Note that the top reflector may be deposited as a contiguous layer, with voids etched through to facilitate adding contacts and/or forming other structures such as mesas. Or the top reflector may be formed as individual closed shapes that align with or overlap the bottom reflectors.

Finally, the method involves depositing (905) electrical contacts (e.g., anodes and cathodes) coupled to the III-N LED layers. Optionally, the method may involve delivering (906) a current to the electrical contacts to cause a non-coherent, spontaneous light emission through one of the top reflectors or the bottom reflectors. Individually controlled currents may be applied to a plurality of elements (e.g., via an active matrix circuit) such that the light emissions form a computer display image.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality.

Terms related to orientation, such as "top," "bottom," "side," and "end," are used to describe relative positions of components (e.g., as arranged in the figures) and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiment.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination and are not meant to be limiting, but purely illustrative. It is intended that the scope of the invention be limited not with this detailed description, but rather determined by the claims appended hereto.

The invention claimed is:

1. A light emitting diode (LED) array comprising:
a semiconductor base layer for III-N growth;
bottom reflectors patterned as an array of closed shapes on a top plane of the base layer;
a three-dimensional III-N structure epitaxially grown around the array of closed shapes and extending above the bottom reflectors, the three-dimensional III-N structure being a contiguous crystalline structure extending across the array;
a laterally grown III-N layer formed in contact with both the reflectors and the three-dimensional III-N structure;
III-N LED layers grown on the laterally grown III-N layer;
one or more top reflectors grown or deposited on the III-N LED layers and located over the bottom reflectors; and
an array of electrical contacts coupled to respective p-type materials and n-type materials of the III-N LED layers, current delivered by the electrical contacts causing non-coherent, spontaneous light emissions through one of the top reflectors or the bottom reflectors.

2. The LED array of claim 1, wherein the bottom or top reflectors comprise distributed Bragg reflectors (DBRs).

3. The LED array of claim 2, wherein the top or bottom DBRs comprise dielectric multilayer structures.

4. The LED array of claim 1, wherein the top reflectors comprise one or more metallic films.

5. The LED array of claim 4, wherein the one or more metallic films comprise one of Ag or Al.

6. The LED array of claim 1, wherein the bottom reflectors comprise Bragg gratings.

7. The LED array of claim 1, wherein the top reflectors, the bottom reflectors, and the electrical contacts form individually addressable light emitting elements that are between 0.2-20 µm in diameter.

8. The LED array of claim 1, wherein the base layer, the three-dimensional III-N structure, and the laterally grown III-N layer comprise an n-type material compatible with epitaxial growth of the III-N LED layers.

9. The LED array of claim 1, wherein the closed shapes comprise one or more of hexagons and triangles.

10. The LED array of claim 1, wherein the semiconductor base layer comprises III-N films on a sapphire or silicon substrate.

11. The LED array of claim 10, wherein the base layer comprises the silicon substrate with <111> crystal orientation.

12. The LED array of claim 1, wherein the three-dimensional III-N structure comprises a GaN structure.

13. The LED array of claim 1, wherein the non-coherent, spontaneous light emissions have a preferred directionality.

14. The LED array of claim 1, wherein the one of the top reflectors or the bottom reflectors through which light is emitted has a mirror reflectivity of less than 95%.

15. An augmented or virtual reality display comprising the LED array of claim 1.

16. A light emitting diode (LED) comprising:
- a semiconductor base layer for III-N growth;
- a bottom reflector patterned as a closed shape on a top plane of the base layer;
- a three-dimensional III-N structure epitaxially grown around the closed shapes and extending above the bottom reflector;
- a laterally grown III-N layer formed in contact with both the reflector and the three-dimensional III-N structure;
- III-N LED layers grown on the laterally grown III-N layer;
- a top reflector grown or deposited on the III-N LED layers and located over the bottom reflector, the top reflector comprising a metal film; and
- electrical contacts coupled to respective p-type materials and n-type materials of the III-N LED layers, current delivered by the electrical contacts causing non-coherent, spontaneous light emissions through one of the top reflector or the bottom reflector.

17. The LED of claim 16, wherein one or both of the bottom reflector and the top reflectors comprise distributed Bragg reflectors (DBRs).

18. The LED of claim 16, wherein the non-coherent, spontaneous light emissions have a preferred directionality.

19. The LED of claim 16, wherein the one of the top reflector or the bottom reflector through which light is emitted has a mirror reflectivity of less than 95%.

20. The LED of claim 16, wherein the three-dimensional III-N structure is part of a contiguous structure that extends across an array of closed shapes that defines an array of other LEDs formed on the base layer.

21. A method comprising:
- patterning bottom reflectors as an array of closed shapes on a top plane of a base layer for epitaxial growth of III-N materials;
- selectively growing epitaxial three-dimensional III-N structures around and extending above the array of closed shapes, the three-dimensional III-N structures being a contiguous crystalline structure that extends across the array of closed shapes;
- laterally growing a III-N layer in contact with both the bottom reflectors and the three-dimensional III-N structures;
- growing III-N LED layers on the laterally grown III-N layer;
- depositing or growing one or more top reflectors on the III-N LED layers; and
- depositing electrical contacts on respective p-type material and n-type material of the III-N LED layers.

* * * * *